United States Patent [19]

Arbanas et al.

[11] Patent Number: 5,063,577
[45] Date of Patent: Nov. 5, 1991

[54] HIGH-SPEED BIT SYNCHRONIZER

[75] Inventors: Glenn A. Arbanas, Salt Lake City; Jeffery M. Thornock, Layton, both of Utah; Christopher R. Keate, Chandler, Ariz.

[73] Assignee: Unisys Corporation, Blue Bell, Pa.

[21] Appl. No.: 449,683

[22] Filed: Dec. 12, 1989

[51] Int. Cl.[5] .............................................. H03D 3/24
[52] U.S. Cl. ..................................... 375/120; 328/133; 328/155
[58] Field of Search ............ 375/120, 119, 106, 80–82, 375/83, 39; 328/133, 155; 307/511, 514; 331/10, 11; 360/51; 329/307

[56] References Cited

U.S. PATENT DOCUMENTS

| | | | |
|---|---|---|---|
| 4,870,382 | 9/1989 | Keate et al. | 375/120 X |
| 4,888,564 | 12/1989 | Tshioaki | 375/120 X |
| 4,933,959 | 6/1988 | Knechtel | 375/120 |

Primary Examiner—Benedict V. Safourek
Assistant Examiner—Tesfaldet Bocure
Attorney, Agent, or Firm—John B. Sowell; Mark T. Starr; Thomas J. Scott

[57] ABSTRACT

A novel high-speed bit synchronizer circuit comprises a phase detector having two phase detecting loops, each adapted to generate a partial error voltage signal which is summed together to provide a single phase voltage error signal which is employed to control a VCO in the return branch of both phase detecting loops. Each phase detecting loop comprises a comparator coupled to the input data stream and to a reference voltage to provide two outputs. An electronic switch is coupled to the output of each comparator and each switch has its partial error voltage output coupled through a summing circuit to the VCO, thus completing two phase detecting loops each adapted to generate a partial phase error signal indicative of the phase error between the input data stream and the recovered clock output of the VCO.

9 Claims, 4 Drawing Sheets

HIGH-SPEED BIT SYNCHRONIZER

BACKGROUND OF THE INVENTION

1. Related Applications

The present invention is related to our U.S. application Ser. No. 07/138,183 filed 28 Dec. 1987, now U.S. Pat. No. 4,870,660 for a Variable Frequency Rate Receiver and to our U.S. application Ser. No. 07/222,700 filed 22 July 1988, now U.S. Pat. No. 4,889,042 for "A High-Speed Multi-Channel Phase Detector".

2. Field of the Invention

The present invention is related to bit synchronizers of the type employed in high-speed devices such as multi-phase shifted key (PSK) receivers. More particularly, the present invention relates to a high-speed bit synchronizer for generating a clock and data output which is synchronized to the input data stream.

3. Description of the Prior Art

Prior art bit synchronizers may be implemented as early-and-late gate bit synchronizers or as delay and multiply and/or by implementing a digital transition tracker. One of these sample and hold early-and-late gate bit synchronizers will be explained with the drawings of the prior art herein. Sample and hold bit synchronizers are analog devices which are both expensive and are relatively slow speed devices that are limited to about 60 megacycles before incurring distortion and excessive jitter. Sample and hold circuits are commercially available as hybrid devices which are relatively large and consume a large amount of power when driven at high speeds. It is difficult to incorporate such devices into miniaturized bit synchronizers. Such sample and hold synchronizers are not capable of high-speed operation. A typical Burr-Brown part SHC 6000BH is rated at 60 megacycles at one percent distortion level and distortion would increase at higher rates. Accordingly, it would be desirable to provide a bit synchronizer which is both faster and cheaper than bit synchronizers heretofore provided in the prior art.

SUMMARY OF THE INVENTION

It is a principal object of the present invention to provide a novel bit synchronizer which can be used for either low or high-speed operation.

It is a principal object of the present invention to provide a bit synchronizer which is small, fast and more economical than prior art bit synchronizers for use in all types of data environments.

It is a principal object of the present invention to provide a simplified bit synchronizer which can be built as a single hybrid circuit with discrete gallium arsenide devices to provide a bit synchronizer operable at speeds up to 10 gigahertz.

It is another general object of the present invention to provide a high-speed bit synchronizer which is less susceptible to drift and jitter.

It is another principle object of the present invention to provide a novel bit synchronizer which does not employ temperature sensitive elements such as capacitors and mixers.

It is another general object of the present invention to provide a high-speed bit synchronizer which is economical enough to be used in a low frequency environment.

It is another general object of the present invention to provide a bit synchronizer capable of being employed at data rates limited only by the frequency of the VCO in the output data stream. Even then, the VCO clock may be multiplied by employing commonly used and known techniques such as delay line phase generators.

It is another general object of the present invention to provide a novel bit synchronizer which does not employ time delay techniques such as used in sample and hold circuits thus provides a real time bit synchronizer.

According to these and other objects of the present invention there is provided a novel bit synchronizer circuit which incorporates a phase detector having a pair of clock enabled comparators which generate real and inverted outputs. The outputs of the clock enabled comparators are coupled to a pair of electronic switches which are operable by the outputs of the clock enabled comparators. The outputs of the electronic switches are summed in negative and positive summing circuits and the output of the negative and positive summing circuits are applied to a summing amplifier to produce an error signal output indicative of the phase difference between the input data stream and the clock recovered from the data. The error signal is applied to a voltage controlled oscillator to provide the recovered clock signal and the recovered clock signal is used to control the clock enabled comparators. The same recovered clock signal is employed to operate a latch having a data stream input to provide bit synchronized output data.

DESCRIPTION OF THE PREFERRED EMBODIMENT

Figure 1:
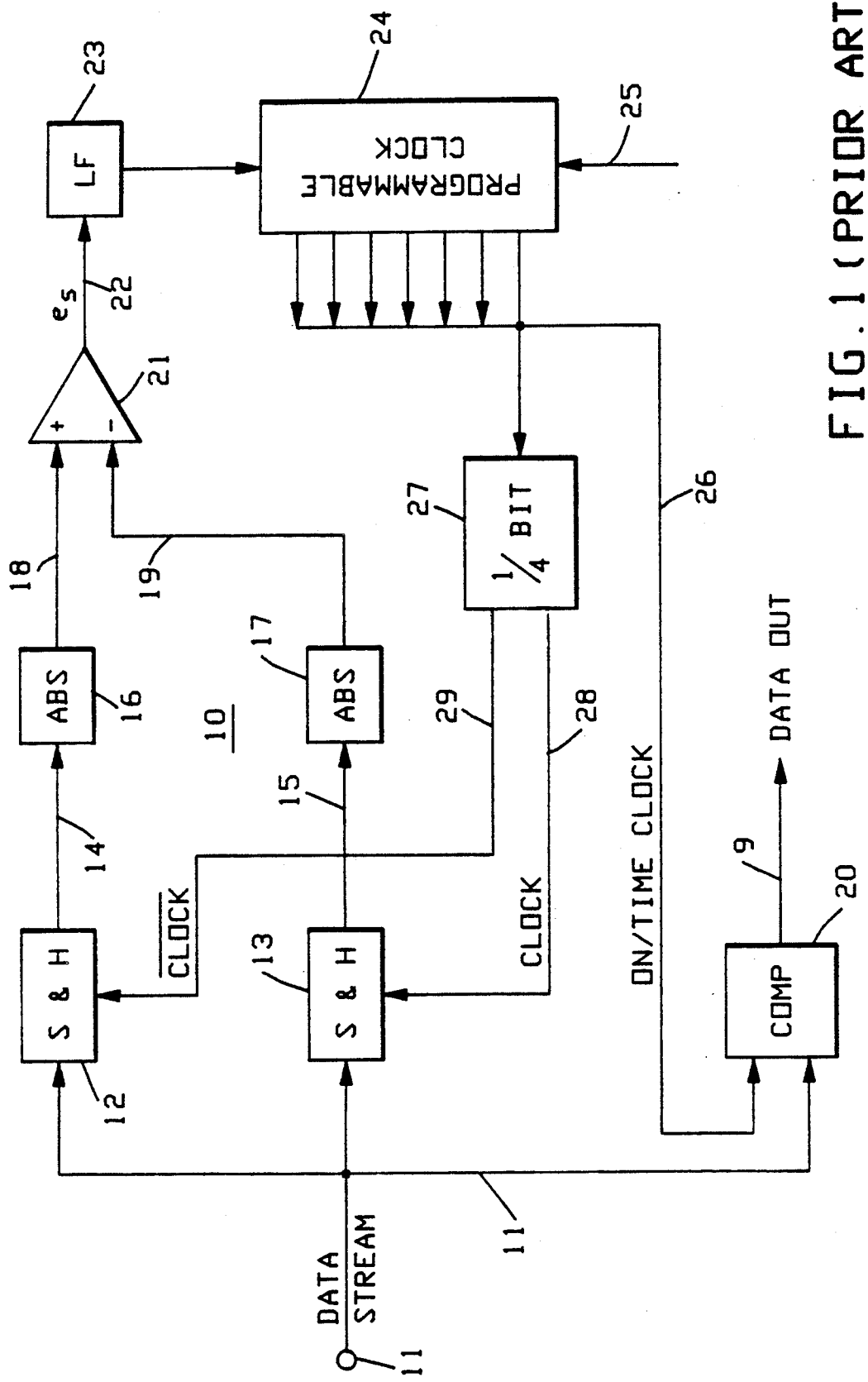
FIG. 1 is a simplified block diagram of a commonly used prior art bit synchronizer.

Refer now to FIG. 1 showing a prior art bit synchronizer of the early-and-late gate type employing sample and hold circuits of the type implemented by Burr-Brown mentioned hereinbefore. Bit synchronizer 10 is shown having a data stream on input line 11 applied to two sample and hold circuits (S&H) 12 and 13 which have their respective outputs on lines 14 and 15 applied to two absolute value detectors (ABS) 16 and 17. The output of the absolute value detectors on lines 18 and 19 are applied to a differential amplifier 21 to produce an error voltage signal $e_s$ on line 22 which is applied to a loop filter 23. The output of the loop filter 23 is applied to a programmable clock 24 which is programmed by a control signal from a processor (not shown) on line 25. The programmable clock 24 may be set at a plurality of predeterminable selectable clock frequencies or may be implemented as a digital synthesized clock to produce an on time clock signal on line 26. The on time clock signal is applied to a one-quarter bit delay device 27 shown having two outputs, one of which is the leading edge of the clock shown as CLK and the other being the trailing edge of the clock shown as $\overline{CLK}$ on lines 28 and 29 respectively. The clock signals on line 28 and 29 are applied to sample and hold circuits 13 and 12 respectively, which synchronize the incoming data on line 11 as will be explained hereinafter. In order to develop an error signal from the outputs of the two sample and hold circuits 12 and 13, absolute value detectors 16 and 17 are employed. The absolute value detectors may be implemented as ring diodes or other equivalent absolute value detectors as explained in our aforementioned U.S. application Ser. No. 07/138,183.

The on time clock on line 26 and the incomming data on line 11 are applied to comparator 20 to provide a data output on line 9.

Figure 2:
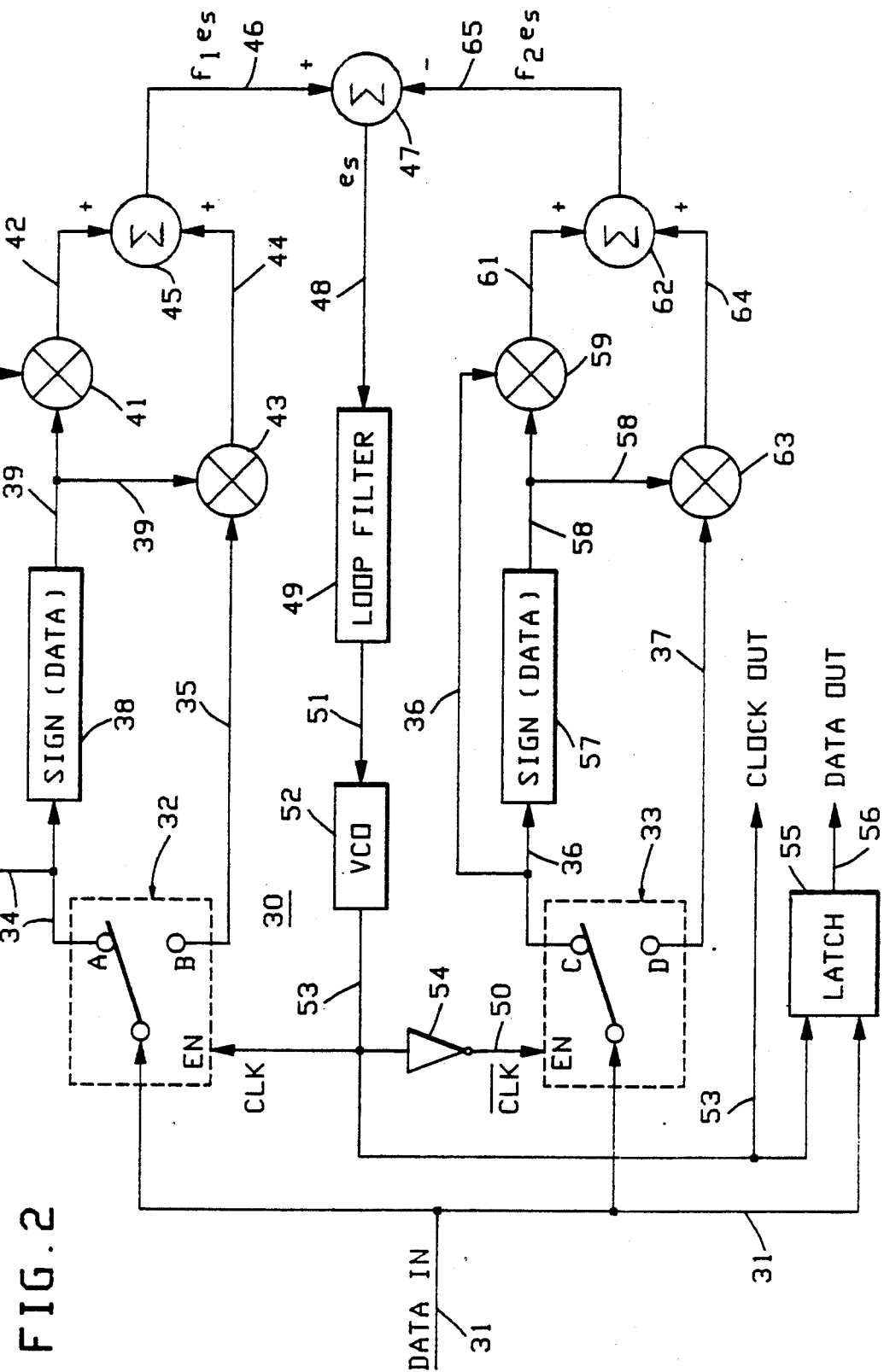
FIG. 2 is a simplified block diagram of the present invention bit synchronizer which is used to explain the operation of the novel phase detector portion.

Refer now to FIG. 2 showing a simplified block diagram of the present invention bit synchronizer 30 having an unmodulated data input 31 of a sine or square wave type. The data stream on line 31 is of the zero crossing type which when applied to electronic switches 32 and 33 produce output signals on lines 34, 35 and 36, 37. Processor block 38 receives the data signal on line 34 and produces a sign output of the data input on line 39 which is applied to a mixer/multiplier 41 along with the data signal on line 34 to provide the absolute value of the data input on line 42. The data signal, when applied to line 35 is coupled to a multiplier/mixer 43 along with the sign data output on line 39 to provide a data signal multiplied by the sign value on line 39 as an output on line 44. The signal on line 44 is applied to a summing or difference circuit 45 to provide a partial error signal on line 46 which is applied to a second summing circuit 47. The output of summing circuit 47 is the error signal which is present on line 48 and applied to a loop filter 49 to provide the filtered error signal on line 51. The error signal drives the voltage control oscillator 52 which produces the on time clock signal on line 53. The on time clock signal is employed as an enable signal for the electronic switches 32 and 33. The clock enable signal at line 53 is applied directly to switch 32 and inverted in inverter 54 before being applied as an enable signal on line 50 to electronic switch 33. The on time clock on line 53 is also applied to a latch 55 along with the input data stream on line 31 to provide the synchronize bit data on line 56.

The output of switch 33 on line 36 operates identically to the output of switch 32 on line 34. The processor block 57 produces a sign output of the data on its output line 58 which is applied to a multiplier/mixer 59 to produce the absolute value of the input data on line 61 which is applied to a summing circuit 62. When the data is applied to line 37 it is multiplied by the data sign value output on line 58 at multiplier/mixer 63 to provide the data signal on line 64. The data signal is applied to the summing circuit 62 to produce a partial error signal on line 65. The signal is applied to the summing circuit 47 to produce the error signal $e_s$ on line 48 described hereinbefore.

The operation of switch 32 is best explained by assuming that switch 32 is enabled. When switch 32 is enabled, the absolute value of the data on line 42 is presented at the output line 46 as a partial error signal. Switch 32 is enabled by a low clock and causes the switch to be in the A position, however, when the clock is high, the electronic switch 32 is disabled and in the B position. When the clock disables electronic switch 32, the signal on line 35 and the sign signal on line 39 are combined in multiplier/mixer 43 to produce a signal on line 44 which appears as a partial error signal on line 46. Stated differently, when the electronic switch 32 is disabled, the last value output of the sign of the data on line 39 is multiplied by the data on line 35 to provide a partial error signal output on line 46.

In similar manner, electronic switch 33 is identical but has an inverted enable clock signal. When the enable signal on line 50 to electronic switch 33 is low, electronic switch 33 is enabled and the switch is in the C position. When the clock signal on line 50 is high, electronic switch 33 is disabled and in the D position. When the electronic switch is in the C position, the partial error signal on line 65 is the same as the signal on line 61. When the electronic switch 33 is disabled, the combined signal on line 64 is the partial error signal on line 65 as explained hereinbefore.

The on time or real time clock at line 53 is provided as an output along with the synchronized bit data on line 56. The advantage of the present bit synchronizer is that it facilitates and permits operational data rates at higher speeds and lower cost.

Figure 3:
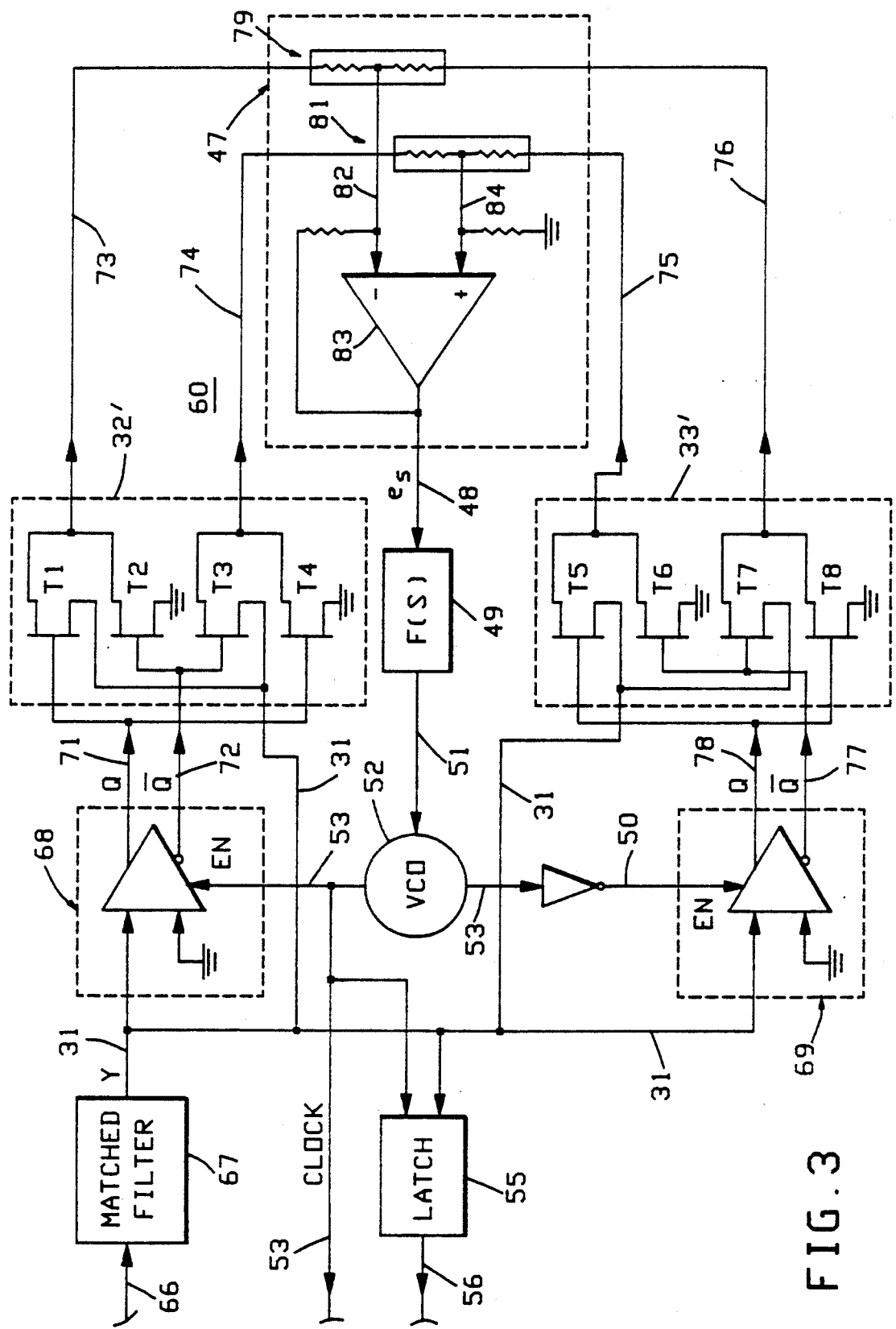
FIG. 3 is a block diagram showing a preferred embodiment hardware implementation of the bit synchronizer shown in FIG. 2.

Refer now to FIG. 3 showing in block diagram format a preferred embodiment hardware implementation of a FIG. 2 bit synchronizer. Hardware bit synchronizer 60 is shown having an unfiltered, unmodulated data stream 66 input. The data is filtered by match filter 67 to provide the aforementioned data stream on line 31 which is now applied to a pair of novel comparators 68 and 69 each having their Q and $\overline{Q}$ outputs applied to the novel electronic switches 32' and 33' whose operation are as follows. A high data signal on line 31 when applied to comparator 68 produces a high Q output on line 71 and a low Q output on line 72. The high Q signal on line 71 enables transistors T1 and T4 which switch the data on line 31 at the source of transistor T1 onto output line 73 and grounds output line 74 through transistor T4. When the data on input line 31 is the low, $\overline{Q}$ signal on line 72 is high turning on transistors T2 and T3 which connects the data on line 31 to output line 74 through transistor T3 and grounds output line 73 through transistor T2. As explained hereinbefore, the electronic comparator 68 is enabled by a low clock signal on line 53 and electronic switch 69 is enabled by a low clock signal on line 50. Assume now for purposes of explanation that a high data signal is present on line 31 as in input to comparator 69. As explained hereinbefore, this high signal enables transistors T5 and T8 which places the data signal on line 31 on output line 75 and grounds output line 76. The inverse is true when the $\overline{Q}$ signal on line 77 is high and the Q signal on line 78 is low, then transistors T6 and T7 are enabled which grounds the output line 75 and places the data signal on output line 76.

Output lines 73 and 74 from the electronic switch 32' are coupled to the negative summing circuit 79 and the positive summing circuit 81 respectively. In similar manner, the output lines 75 and 76 from electronic switch 33' are connected to the positive summing circuit 81 and the negative summing circuit 79 respectively. The negative summing circuit 79 sums the negative outputs and provides a negative sum signal on line 82 which is applied to the negative input of differential amplifier 83 and the output of positive summing circuit on line 84 is applied to the positive input of differential amplifier 83. The summing circuit 47 (shown in phantom lines) produces an error signal $e_s$ on line 48 which is applied to the loop filter 49 to provide a filtered error signal on line 51 that steers or corrects the voltage control oscillator 52 to supply the on time clock on line 53. The on time clock on line 53 is shown having a direct clock output and an output connected to the aforementioned latch 55 to produce the aforementioned bit synchronized data signal on line 56. The elements 68 and 32' are similar to those shown in our aforementioned pending U.S. application Ser. No. 07/222,700 but have been modified in order to provide the present invention bit synchronizer shown in FIGS. 2 and 3.

The input data on line 31 to comparators 68 and 69 may be explained with reference to their respective outputs Q and $\overline{Q}$. When the input is equal to or greater than zero, the output Q is high active if the clock enable signal is present on line 53, otherwise the output $\overline{Q}$ is high and Q is low. If the clock enable signal on line 53 is absent, the comparators 68 and 69 retain both Q and $\overline{Q}$ in the last enabled state before being disabled.

Figure 4:
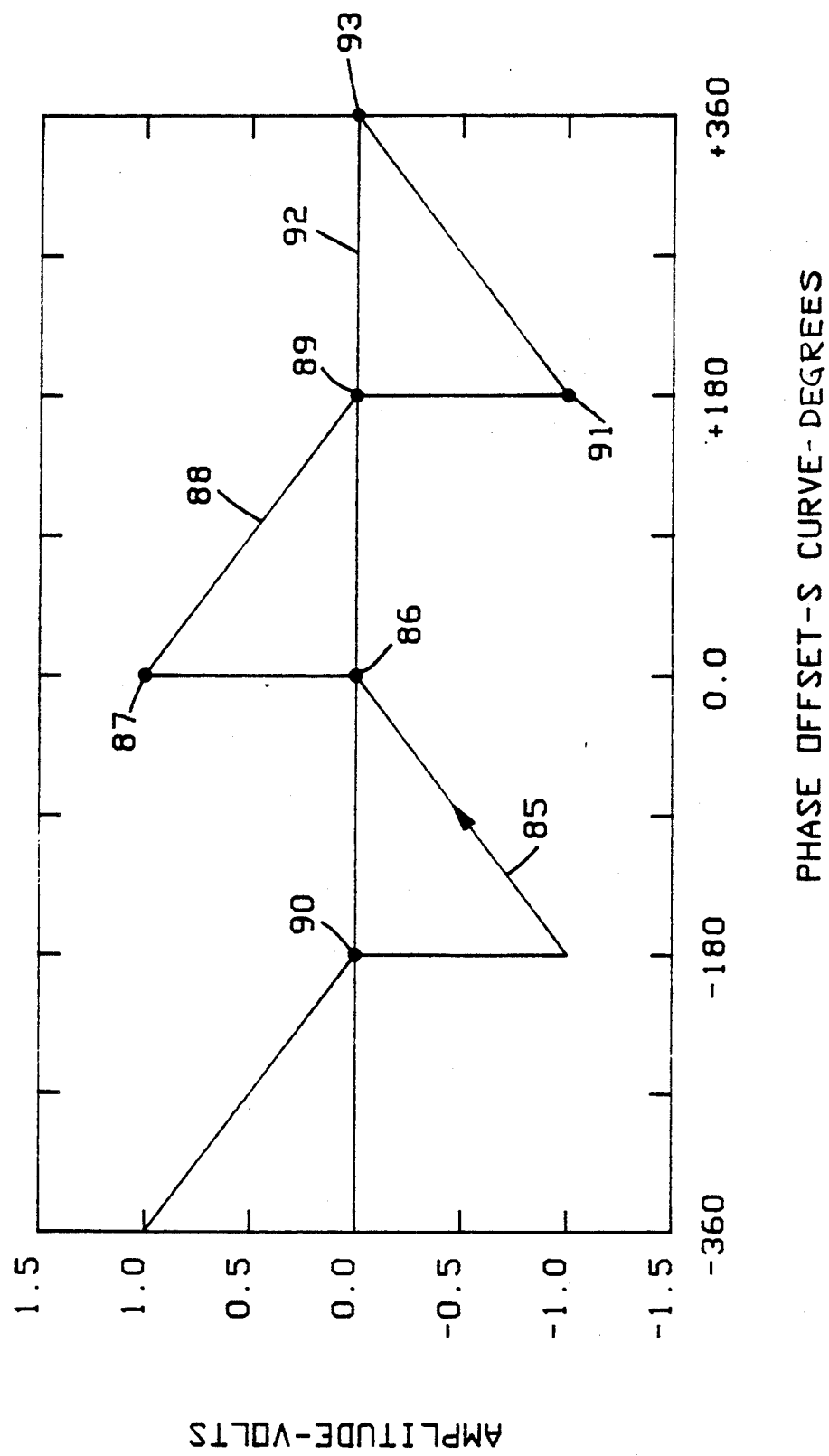
FIG. 4 is a schematic diagram of an actual novel "S" curve produced by the present invention bit synchronizer.

Refer now to FIG. 4 showing a schematic diagram of an actual novel S curve produced by the present invention bit synchronizer. The abscissa is shown in voltage amplitude terms and the ordinate is shown in degrees of phase offset. When the S curve reaches the zero voltage point 90 of the curve at $-180°$ it is at a non-locked zero crossover position proceeding from positive to negative. When the curve portion 85 moves from $-180°$ in the positive direction and reaches the zero crossover line 92 at point 86 it is at a locked position. Even though the curvei rises vertically to point 87, it is capable of correcting, thus, seeks to return to the locked point 86. In similar manner, when the S curve portion 88 proceeds in the negative direction to cross the zero crossover line 92 at node 89, it is a non-locked position which abruptly changes in the negative direction to point 91 and then proceeds in the positive phase offset direction toward the zero crossover point 93. When it crosses the zero access line 92 going from the negative to the positive direction, it reaches another locked point 93. Persons familiar with sinusoidal S curves produced by bit synchronizers may find difficulty in interpreting the advantage of the S curve shown in FIG. 4. However, the zero crossover lock points 86 and 93 are so distinct and unique that the present bit synchronizer operates at very high speeds with less jitter than all of the aforementioned prior art circuits including the early-and-late gate sample and hold circuit.

What is claimed is:

1. A high-speed bit synchronizer circuit for generating a recovered clock and synchronized data from a data stream, comprising:
   phase detector means coupled to an input data stream having zero crossing data,
   said phase detector means being enabled by said recovered clock comprising a pair of recovered clock enabled comparators each having a real (Q) and an inverted ($\overline{Q}$) data output,
   a pair of electronic switches coupled to said input data stream, and each one of said electronic switches being further coupled to the Q and $\overline{Q}$ data output of one of said associated pairs of comparators each having a positive and a negative output line,
   a negative summing circuit having input terminals connected to the negative output lines of each of said pair of electronic switches to provide a summed negative output,
   a positive summing circuit having input terminals connected to the positive output lines of each of said pair of electronic switches to provide a summed positive output,
   a summing amplifier having a positive input coupled to said summed positive output of said positive summing circuit and a negative input coupled to said summed negative output of said negative summing circuit to provide an error signal output indicative of the phase difference between said input data stream and said recovered clock,
   voltage controller oscillator (VCO) means having its input coupled to said error signal output from said summing amplifier for providing said recovered clock as an output, and
   data recover means having inputs coupled to said input data stream and to said recovered clock signal to provide synchronized bit data as output signals.

2. A high-speed bit synchronizer as set forth in claim 1 wherein said data recovery means comprise a latch circuit.

3. A high-speed bit synchronizer as set forth in claim 1 wherein said clock enabled comparators comprise latch comparators having a ground reference input and a data stream input.

4. A high-speed bit synchronizer as set forth in claim 1 wherein said VCO means has a first output coupled to an enable input of one of said comparators.

5. A high-speed bit synchronizer as set forth in claim 4 wherein said VCO means has a second output coupled through an invertor to an enable input of the other one of said pair of comparators.

6. A high-speed bit synchronizer as set forth in claim 1 wherein said recovered clock is a signal having a leading edge and a trailing edge and said phase detector comprises two phase detecting branches, one branch for detecting a first partial phase error signal between said input data stream and the leading edge of said recovered clock and another branch for detecting a second partial phase error signal between said input data stream and the trailing edge of the recovered clock.

7. A high-speed bit synchronizer as set forth in claim 6 wherein said partial phase error signals are generated one half of one recovered clock cycle apart and said error signal output from said summing amplifier is a positive or a negative analog voltage signal for speeding up or slowing down said VCO output.

8. A high-speed bit synchronizer as set forth in claim 7 wherein said error signal output is indicative of an S curve when amplitude is plotted against phase offset.

9. A high-speed bit synchronizer as set forth in claim 3 wherein said S curve at the zero crossover point changes from a diagonal slanting line to a sharp vertical departure from said zero crossover point.

* * * * *